(12) United States Patent
Kang et al.

(10) Patent No.: US 7,674,749 B2
(45) Date of Patent: Mar. 9, 2010

(54) DONOR SUBSTRATE AND FABRICATION METHOD OF ORGANIC LIGHT EMITTING DISPLAY USING THE SAME

(75) Inventors: Tae-Min Kang, Suwon-si (KR); Seong-Taek Lee, Suwon-si (KR); Mu-Hyun Kim, Suwon-si (KR); Byung-Doo Chin, Suwon-si (KR); Myung-Won Song, Suwon-si (KR); Jae-Ho Lee, Suwon-si (KR); Jin-Soo Kim, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 995 days.

(21) Appl. No.: 11/247,278

(22) Filed: Oct. 12, 2005

(65) Prior Publication Data

US 2006/0084006 A1 Apr. 20, 2006

(30) Foreign Application Priority Data

Oct. 19, 2004 (KR) ...................... 10-2004-0083744

(51) Int. Cl.
*B41M 5/035* (2006.01)
*B41M 5/50* (2006.01)
(52) U.S. Cl. ...................... 503/227; 428/32.81; 430/945
(58) Field of Classification Search ........................ None
See application file for complete search history.

(56) References Cited

U.S. PATENT DOCUMENTS 5,937,272 A   8/1999   Tang
5,998,085 A  12/1999   Isberg et al.
6,114,088 A   9/2000   Wolk et al.
6,214,520 B1  4/2001   Wolk et al.
6,228,555 B1* 5/2001   Hoffend et al. ............. 430/200

FOREIGN PATENT DOCUMENTS

CN         1337905       2/2002

(Continued)

OTHER PUBLICATIONS

Chinese Office action corresponding to Chinese Patent Application No. 200510113840.X, issued on Jun. 27, 2007.

(Continued)

*Primary Examiner*—Bruce H Hess
(74) *Attorney, Agent, or Firm*—Robert E. Bushnell, Esq.

(57) ABSTRACT

A donor substrate for use in an organic light emitting display comprises a base substrate and a transfer layer disposed on the base substrate. A selective heat generation structure is interposed between the base substrate and the transfer layer. The selective heat generation structure has a heat generation region from which heat is generated by light-to-heat conversion and a heat non-generation region contacting the heat generation region. By employing the donor substrate, it is possible to form minute transfer layer patterns with high accuracy without the need to accurately control the width of a laser beam. A fabrication method of an organic light emitting display comprises disposing the donor substrate on an acceptor substrate, irradiating a laser beam onto the donor substrate, and forming a transfer layer pattern on a pixel electrode of the acceptor substrate.

29 Claims, 6 Drawing Sheets

FOREIGN PATENT DOCUMENTS

| | | |
|---|---|---|
| EP | 0883190 | 12/1998 |
| JP | 11-54275 | 2/1999 |
| JP | 2000-515083 | 11/2000 |
| JP | 2002-534782 | 10/2002 |
| KR | 2000-0005446 | 1/2000 |
| KR | 2003-0077646 | 9/2002 |

OTHER PUBLICATIONS

European Search Report for European Patent Application No. EP 05109540 dated Feb. 2, 2006.
Korean Office Action for Korean Patent Application No. 2004-83744 issued on Apr. 27, 2006.
Japanese Office action corresponding to Japanese Patent Application No. 2005-299226, issued on Apr. 8, 2008.

* cited by examiner

DONOR SUBSTRATE AND FABRICATION METHOD OF ORGANIC LIGHT EMITTING DISPLAY USING THE SAME

CLAIM OF PRIORITY

This application makes reference to, incorporates the same herein, and claims all benefits accruing under 35 U.S.C. § 119 from an application for DONOR SUBSTRATE AND FABRICATION METHOD OF ORGANIC LIGHT EMITTING DISPLAY USING THE SAME earlier filed in the Korean Intellectual Property Office on the 19 of Oct., 2004 and there duly assigned Serial No. 2004-83744.

BACKGROUND OF THE INVENTION

1. Technical Field

The present invention relates to a donor substrate and, more particularly, to a donor substrate for laser thermal transfer, and to a fabrication method of an organic light emitting display using the donor substrate.

2. Related Art

In general, at least a laser beam, an acceptor substrate and a donor film are required to use a laser thermal transfer imaging method. The donor film comprises a base film, a light-to-heat conversion layer disposed on the entire surface of the base film, and a transfer layer disposed on the entire surface of the light-to-heat conversion layer. In order to execute such a laser thermal transfer imaging method, the donor film is laminated on the acceptor substrate so that the transfer layer faces the acceptor substrate. Subsequently, a laser beam is irradiated onto the donor film. Accordingly, transfer layer patterns are formed on the acceptor substrate. This technology is disclosed in U.S. Pat. Nos. 5,998,085, 6,214,520, and 6,114,088.

The formation of transfer layer patterns on the acceptor substrate by irradiating the laser beam onto the base film is now described in detail. The laser beam is irradiated onto parts of the base film. At this point, the light-to-heat conversion layer in the areas onto which the laser beam is irradiated absorbs the laser beam, and converts the laser beam to thermal energy. The transfer layer contacting the regions of the light-to-heat conversion layer, from which the thermal energy is generated is transferred to the acceptor substrate selectively by the thermal energy, thereby forming transfer layer patterns. In this case, the width of the transfer layer pattern corresponds to the width of the laser beam. Therefore, if it is intended to minutely form the transfer layer pattern, the width of the laser beam should be adjusted with accuracy. However, the accurate adjustment of the width of the laser beam requires a highly accurate laser apparatus. Such a laser apparatus with high accuracy comes at a high price, thereby causing an increase in the fabrication cost of an organic light emitting display.

SUMMARY OF THE INVENTION

In order to solve the aforementioned problems, the present invention provides a donor substrate which permits accurate formation of a minute transfer layer pattern without requiring accurate control of the width of a laser beam.

The present invention also provides a fabrication method of an organic light emitting display, which method permits the accurate formation of a minute transfer layer pattern using the donor substrate.

According to an aspect of the present invention, a donor substrate includes a base substrate and a transfer layer disposed on the base substrate. A selective heat generation structure is interposed between the base substrate and the transfer layer. The selective heat generation structure has a heat generation region from which heat is generated by light-to-heat conversion, and a heat non-generation region contacting the heat generation region.

According to another aspect of the present invention, a donor substrate comprises: a base substrate and a light-to-heat conversion (LTHC) layer pattern selectively disposed on a part of the base substrate. A transfer layer is disposed on the light-to-heat conversion layer pattern.

According to another aspect of the present invention, a donor substrate comprises a base substrate, and a reflective layer pattern is selectively disposed on a part of the base substrate, the reflective layer pattern being covered with a light-to-heat conversion layer.

According to another aspect of the present invention, there is provided a fabrication method of an organic light emitting display using the donor substrate. In the fabrication method, the donor substrate described above is first prepared. Then, the donor substrate is disposed on an acceptor substrate having at least a pixel electrode so that the transfer layer of the donor substrate faces the acceptor substrate. A transfer layer pattern is then formed on the pixel electrode of the acceptor substrate by irradiating a laser beam, having a width greater than that of the heat generation region, onto the donor substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
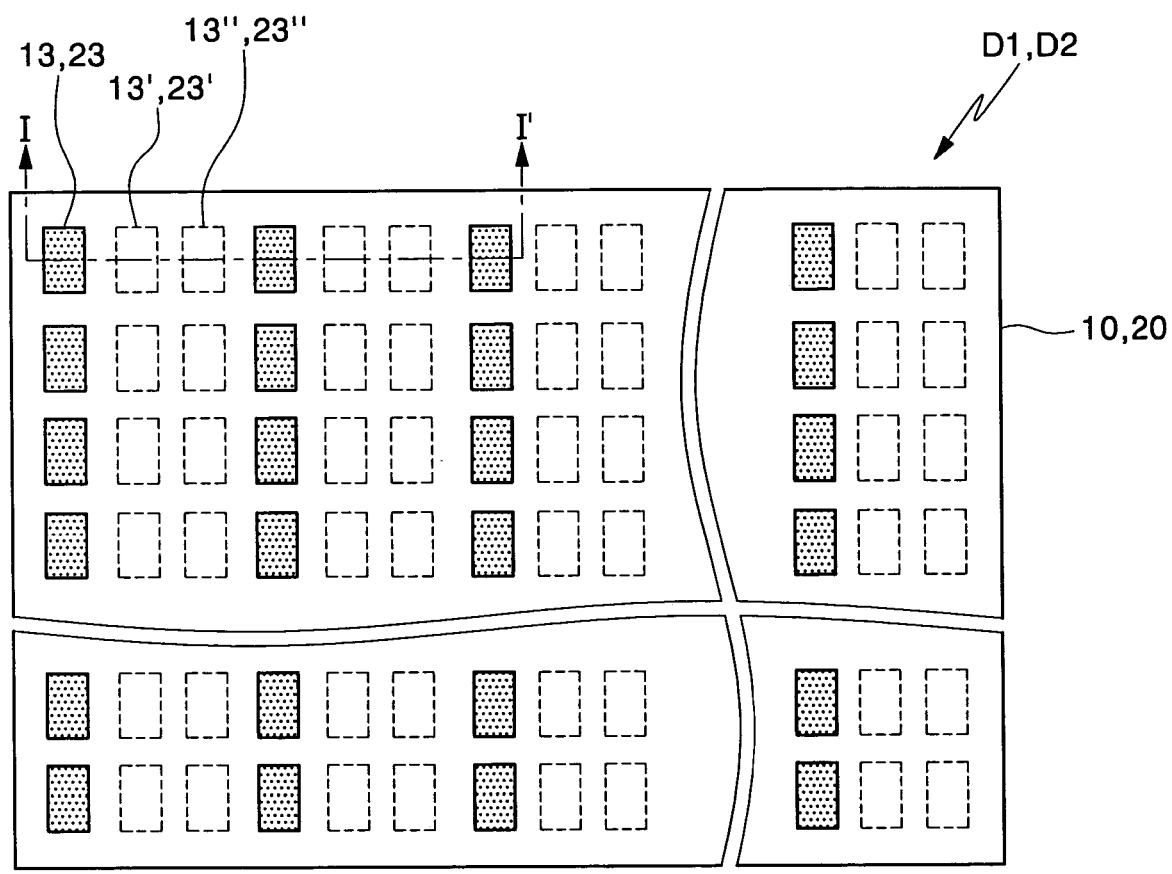
FIG. 1 is a plan view of a donor substrate according to two embodiments of the present invention.

In order to more specifically explain the present invention, exemplary embodiments of the present invention will be described in detail with reference to the attached drawings. However, the present invention is not limited to the exemplary embodiments, but may be embodied in various forms. In the figures, if a layer is formed on another layer or a substrate, it means that the layer is directly formed on another layer or a substrate, or that a third layer is interposed therebetween. In the following description, identical reference numerals denote identical elements.

FIG. 1 is a plan view of a donor substrate according to two embodiments of the present invention.

Referring to FIG. 1, a donor substrate D1 or D2 comprises a base substrate 10 or 20. Light-to-heat conversion layer patterns 13 or 23 are disposed on parts of the base substrate 10 or 20. In the present embodiments, the light-to-heat conversion layer patterns 13 or 23 define heat generation regions.

The donor substrate D1 or D2 may be used to form an emission layer of an organic light emitting display. In this case, the light-to-heat conversion layer patterns 13 or 23 correspond to respective unit pixel regions of the organic light emitting display. When the organic light emitting display displays a full color image of red, green and blue, a red emission layer, a green emission layer and a blue emission layer are patterned, respectively. In this case, three sheets of donor substrates are required, and the three sheets of donor substrates can include first light-to-heat conversion layer patterns 13 or 23, second light-to-heat conversion layer patterns 13' or 23', and third light-to-heat conversion layer patterns 13" or 23" different in position from each other, respectively. In the FIG. 1, a donor substrate D1 or D2 for forming striped emission layer patterns is shown, but the present invention is not limited to that. Instead, the present invention may be applied to a donor substrate for forming dotted or delta emission layer patterns. Furthermore, the present invention may be applied to a donor substrate for forming a variety of different patterns on an acceptor substrate.

Figure 2A:
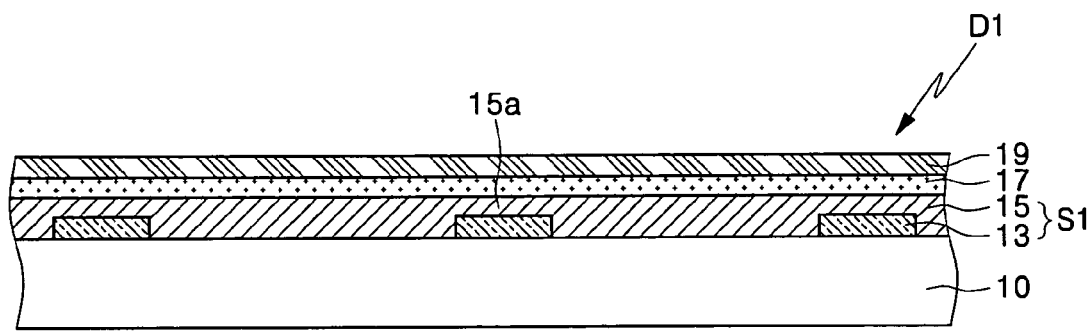
FIG. 2A is a cross-sectional view taken along Line I-I' of FIG. 1, and shows a donor substrate according to a first embodiment of the present invention.

FIG. 2A is a cross-sectional view taken along Line I-I' of FIG. 1, and shows a donor substrate according to a first embodiment of the present invention.

Referring to FIG. 2A, the donor substrate D1 comprises a base substrate 10. Preferably, the base substrate 10 has a high permeability for a laser beam, high thermal resistance, and proper flexibility and mechanical strength. Therefore, the base substrate 10 may be made of a polyester film. Specifically, the base substrate 10 may be made of a polyethylene terephthalate film or a polyethylene naphthalate film. The thickness of the base substrate 10 preferably ranges from 10 mm to 500 μm.

A transfer layer 19 is disposed on the base substrate 10. The transfer layer 19 is disposed on the entire top surface of the base substrate 10. The transfer layer 19 may be an electroluminescent organic layer, in other words, an emission layer. Moreover, the transfer layer 19 may further comprise at least one layer selected from a group consisting of a hole-injecting organic layer, a hole-transporting organic layer, a hole-blocking organic layer, an electron-transporting organic layer, and an electron-injecting organic layer.

A selective heat generation structure S1 is interposed between the base substrate 10 and the transfer layer 19. The selective heat generation structure S1 comprises a heat generation region from which heat is generated by light-to-heat conversion, and a heat non-generation region adjacent to the heat generation region. The heat non-generation region is not a region from which heat is not generated absolutely. Rather, "heat non-generation" should be understood as a relative concept with respect to "heat generation".

In the present embodiment, the selective heat generation structure S1 comprises light-to-heat conversion (LTHC) layer patterns 13 selectively disposed on parts of the base substrate 10. The light-to-heat conversion layer pattern 13 defines the heat generation region. The light-to-heat conversion layer pattern 13 absorbs a part of a laser beam, and converts the absorbed laser beam into heat. Therefore, heat can be selectively generated from the light-to-heat conversion layer patterns 13. At this point, the transfer layer 19 contacting the light-to-heat conversion layer patterns 13 is degraded in adhesive power due to the heat. Accordingly, the transfer layer 19 is selectively transferred to an acceptor substrate, thereby forming transfer layer patterns. As a result, it is possible to form minute transfer layer patterns regardless of the width of the laser beam.

The light-to-heat conversion layer pattern 13 contains a light-absorbing material. Examples of the light-absorbing material include carbon black, graphite, metal oxide, and metal sulfide. Moreover, the light-to-heat conversion layer pattern 13 may further contain a binder. Suitable examples of the light-to-heat conversion layer pattern 13 include an organic layer in which carbon black is dispersed in an organic binder, and a metal layer containing metal oxide or metal sulfide. When the light-to-heat conversion layer pattern 13 is an organic layer, the light-to-heat conversion layer pattern 13 can be formed using a screen printing method. On the other hand, when the light-to-heat conversion layer pattern 13 is a metal layer, the light-to-heat conversion layer pattern 13 can be formed using a vacuum deposition method, an electron beam deposition method, or a sputtering method, which employ a highly accurate mask.

The selective heat generation structure S1 may further comprise a reflective layer 15 disposed on those portions of the base substrate 10 not covered by the light-to-heat conversion layer pattern 13. The reflective layer 15 is a layer having a proper reflectance for a laser beam, and reflects the laser beam input through the base substrate 10. Therefore, the reflective layer 15 can define the heat non-generation region. Preferably, the reflective layer 15 may be at least one layer selected from a group consisting of an aluminum layer, an aluminum alloy layer, a silver layer, and a silver alloy layer.

It is preferable that the reflective layer 15 cover the light-to-heat conversion layer pattern 13. In this case, the region 15a of the reflective layer 15 which is positioned on the light-to-heat conversion layer pattern 13 reflects the laser beam passing through the light-to-heat conversion layer pattern 13, and returns the laser beam into the light-to-heat conversion layer pattern 13. Accordingly, the light-to-heat conversion rate in the light-to-heat conversion layer pattern 13 can be enhanced.

An intermediate layer 17 can be interposed between the selective heat generation structure S1 including the reflective layer 15 and the transfer layer 19. The intermediate layer 17 serves to prevent the light-absorbing material (for example, carbon black) contained in the light-to-heat conversion layer pattern 13 from contaminating the transfer layer 19, and also serves to block gas generated when the light-to-heat conversion layer pattern 13 converts the laser beam into heat. It is preferable that the intermediate layer 17 be made of a material having high thermal resistance, and that it have adhesive power relative to the transfer layer 19. The intermediate layer 17 may be an organic layer, an inorganic layer, or a compound layer thereof. The organic layer may be a high-molecular film made of acrylic resin or alkyd resin, and the inorganic layer may be a metal oxide layer.

On the other hand, the reflective layer 15 may be omitted. In this case, the intermediate layer 17 is interposed between the light-to-heat conversion layer pattern 13 and the transfer layer 19, that is, between the transfer layer 19 and the selective heat generation structure S1 not including the reflective layer 15. Specifically, the intermediate layer 17 covers the light-to-heat conversion layer pattern 13.

Figure 2B:
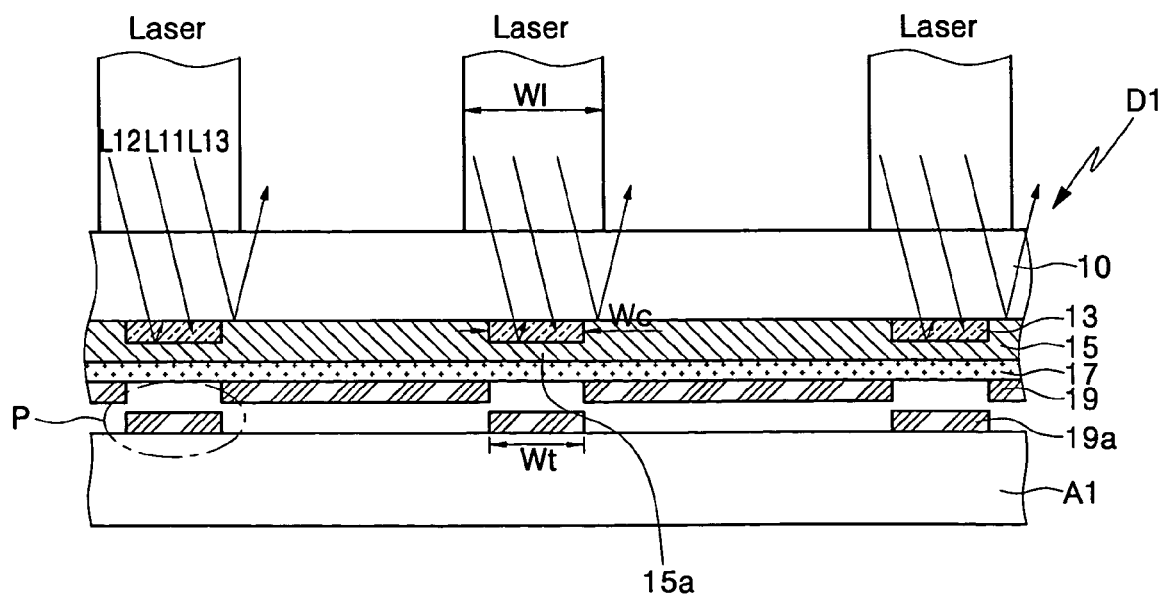
FIG. 2B is a cross-sectional view illustrating a fabrication method of an organic light emitting display using the donor substrate shown in FIG. 2A.

FIG. 2B is a cross-sectional view illustrating a fabrication method of an organic light emitting display using the donor substrate shown in FIG. 2A.

Referring to FIG. 2B, the donor substrate D1 described with reference to FIG. 2A is disposed on an acceptor substrate A1 having at least a pixel electrode so that the transfer layer 19 faces the acceptor substrate A1. Subsequently, a laser beam is irradiated onto the donor substrate D1. The laser beam may be a beam patterned in a line beam shape. The patterned laser beam is irradiated onto the heat generation region of the donor substrate D1. Moreover, the width W1 of the laser beam is greater than the width Wc of the heat generation region.

The laser beam L11 irradiated onto the donor substrate D1 is transmitted by the base substrate 10 and is partially absorbed by the light-to-heat conversion layer pattern 13. Moreover, when the reflective layer 15 covering the light-to-heat conversion layer pattern 13 is provided, the laser beam L12 not absorbed but transmitted by the light-to-heat conversion layer pattern 13 is reflected by the reflective layer 15a on the light-to-heat conversion layer pattern 13, and is returned into the light-to-heat conversion layer pattern 13. Accordingly, the light-to-heat conversion rate in the light-to-heat conversion layer pattern 13 can be enhanced. On the other hand, the laser beam L13 irradiated onto the reflective layer 15 adjacent to the sides of the light-to-heat conversion layer pattern 13 is reflected by the reflective layer 15. When the reflective layer 15 is not provided, the laser beam passes through the sides of the light-to-heat conversion layer pattern 13. As a result, heat can be selectively generated from the region in which the light-to-heat conversion layer pattern 13 is formed.

The heat generated from the light-to-heat conversion layer pattern 13 degrades adhesive power between the intermediate layer 17 and the transfer layer 19, thereby selectively transferring the transfer layer 19 onto the acceptor substrate A1. Consequently, it is possible to form a transfer layer pattern 19a on the acceptor substrate A1.

In the present embodiment, the width W1 of the laser beam can be greater than the width Wt of the transfer layer pattern patterned on the acceptor substrate A1. Therefore, it is possible to obtain a minute transfer layer pattern without accurately controlling the width W1 of the laser beam.

Figure 3A:
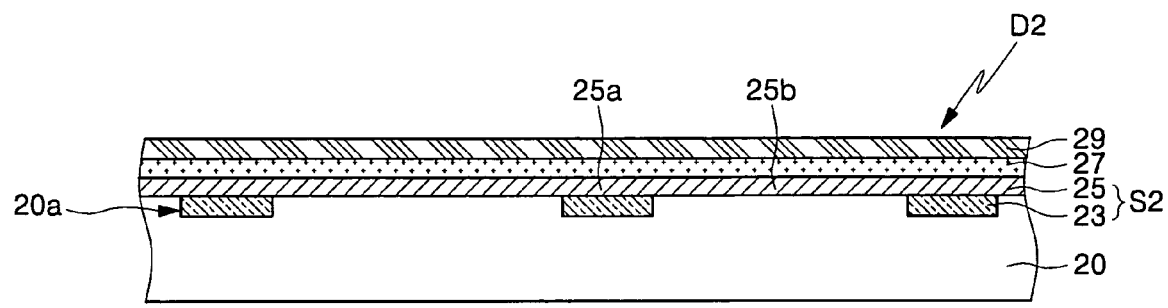
FIG. 3A is a cross-sectional view taken along Line I-I' of FIG. 1, and shows a donor substrate according to a second embodiment of the present invention.

FIG. 3A is a cross-sectional view taken along Line I-I' of FIG. 1, and shows a donor substrate according to a second embodiment of the present invention. The donor substrate according to the present embodiment is similar to the donor substrate described with reference to FIG. 2A, except as described below.

Referring to FIG. 3A, a donor substrate D2 comprises a base substrate 20 and a transfer layer 29 disposed on the base substrate 20.

A selective heat generation structure S2 is interposed between the base substrate 20 and the transfer layer 29. The selective heat generation structure S2 comprises a heat generation region from which heat is generated by light-to-heat conversion, and a heat non-generation region adjacent to the heat generation region.

The selective heat generation structure S2 comprises light-to-heat conversion (LTHC) layer patterns 23 selectively disposed on parts of the base substrate 20. In the present embodiment, the base substrate 20 has recessed regions 20a, and the light-to-heat conversion layer patterns 23 are selectively disposed in the recessed regions 20a. The light-to-heat conversion layer patterns 23 selectively disposed in the recessed regions 20a define the heat generation regions.

The base substrate 20 having the recessed regions 20a can be manufactured using, for example, a mold. The light-to-heat conversion layer patterns 23 can be selectively formed in the recessed regions 20a using an air knife coating method or a blade coating method.

The selective heat generation structure S2 may further comprise a reflective layer 25 interposed between the transfer layer 29 and both the light-to-heat conversion layer patterns 23 and the base substrate 20. The reflective layer 25 reflects the laser beam inputted through the base substrate 20. Specifically, since a region 25b of the reflective layer 25 adjacent to the sides of each light-to-heat conversion layer pattern 23 reflects the laser beam, the reflective layer 25 can define the heat non-generation region. A region 25a of the reflective layer 25, which is positioned on the light-to-heat conversion layer pattern 23, reflects the laser beam passing through the light-to-heat conversion layer pattern 23, and returns the laser beam into the light-to-heat conversion layer pattern 23. Accordingly, the light-to-heat conversion rate in the light-to-heat conversion layer patterns 23 can be enhanced.

An intermediate layer 27 can be interposed between the selective heat generation structure S2 including the reflective layer 25 and the transfer layer 29. On the other hand, the reflective layer 25 may be omitted. In this case, the intermediate layer 27 can be interposed between the transfer layer 19 and both the light-to-heat conversion layer patterns 23 and the base substrate 20.

Figure 3B:
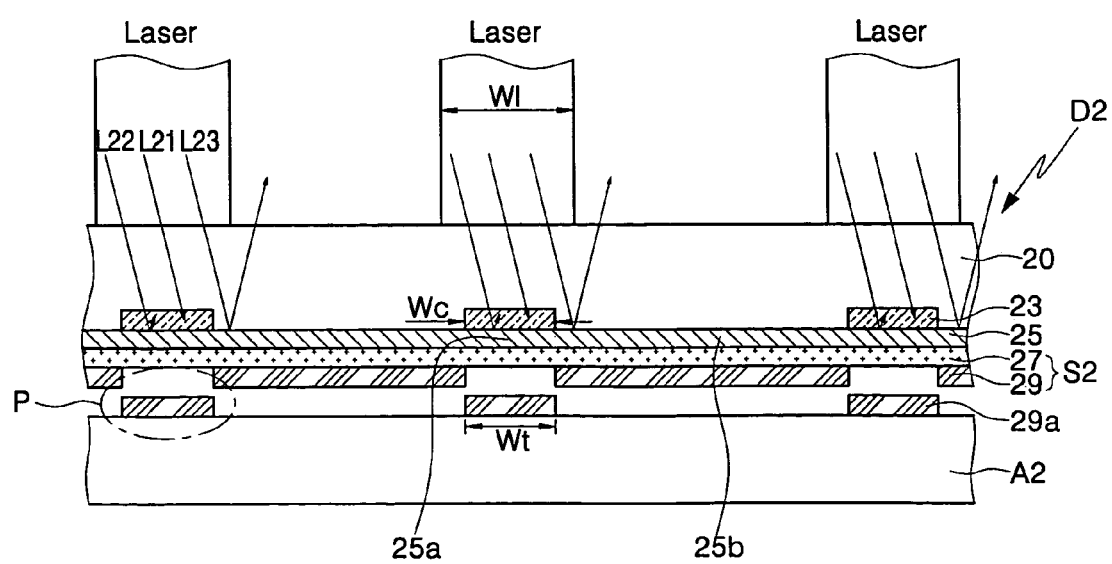
FIG. 3B is a cross-sectional view illustrating a fabrication method of an organic light emitting display using the donor substrate shown in FIG. 3A.

FIG. 3B is a cross-sectional view illustrating a fabrication method of an organic light emitting display using the donor substrate shown in FIG. 3A.

Referring to FIG. 3B, the donor substrate D2 described with reference to FIG. 3A is disposed on an acceptor substrate A2 so that the transfer layer 29 faces the acceptor substrate A2. Subsequently, a laser beam is irradiated onto the donor substrate D2. The laser beam may be a beam patterned in a line beam shape. The patterned laser beam is irradiated onto the heat generation regions of the donor substrate D2. Moreover, the width W1 of each laser beam is greater than the width Wc of each heat generation region.

The laser beam L21 irradiated onto the donor substrate D2 is partially absorbed by the light-to-heat conversion layer pattern 23. Moreover, when the reflective layer 25 is provided on the light-to-heat conversion layer pattern 23, the laser beam L22 not absorbed but transmitted by the light-to-heat conversion layer pattern 23 is reflected by the reflective layer 25a on the light-to-heat conversion layer pattern 23, and is returned into the light-to-heat conversion layer pattern 23. Accordingly, the light-to-heat conversion rate in the light-to-heat conversion layer pattern 23 can be enhanced. On the other hand, the laser beam L23 irradiated onto the region 25b of the reflective layer 25 adjacent to the sides of the light-to-heat conversion layer pattern 23 is reflected by the reflective layer 25. When the reflective layer 25 is not provided, the laser beam passes through the sides of the light-to-heat conversion layer pattern 23. As a result, heat can be selectively generated from the region in which the light-to-heat conversion layer pattern 23 is formed.

The heat generated from the light-to-heat conversion layer pattern 23 degrades the adhesive power between the intermediate layer 27 and the transfer layer 29, thereby selectively transferring the transfer layer 29 onto the acceptor substrate A2. Consequently, it is possible to form a transfer layer pattern 29a on the acceptor substrate A2.

Figure 4:
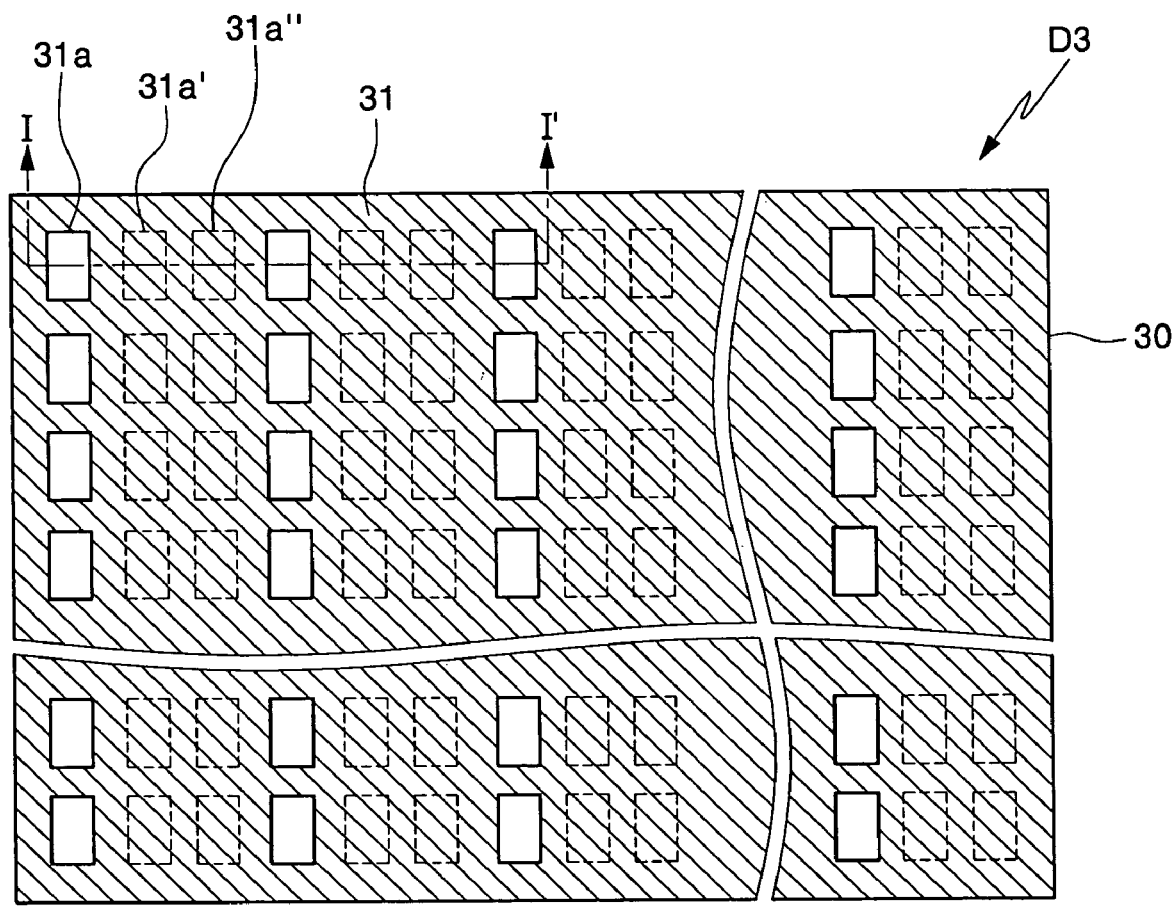
FIG. 4 is a plan view of a donor substrate according to another embodiment of the present invention.

FIG. 4 is a plan view of a donor substrate according to another embodiment of the present invention.

Referring to FIG. 4, a donor substrate D3 comprises a base substrate 30. Reflective layer patterns 31 are disposed on parts of the base substrate 30. Each reflective layer pattern 31 defines a heat non-generation region. A light-to-heat conversion layer is disposed on regions 31a of the base substrate 30 exposed to the sides of the reflective layer pattern 31. That is, the exposed region 31a can define a heat generation region.

The donor substrate D3 may be used to form an emission layer of an organic light emitting display. In this case, the exposed regions 31a, in which the light-to-heat conversion layer is exposed, correspond to respective unit pixel regions of the organic light emitting display. When the organic light emitting display displays a full color image of red, green and blue, three sheets of donor substrates are required. The three sheets of donor substrates can include reflective layer patterns having first exposed regions 31a, second exposed regions 31a', and third exposed regions 31a" different in position from each other, respectively. In FIG. 4, a donor substrate D3 for forming striped emission layer patterns is shown, but the present invention is not limited to that. Instead, the present invention may be applied to a donor substrate for forming dotted or delta emission layer patterns. Furthermore, the present invention may be applied to a donor substrate for forming a variety of different patterns on an acceptor substrate.

Figure 5A:
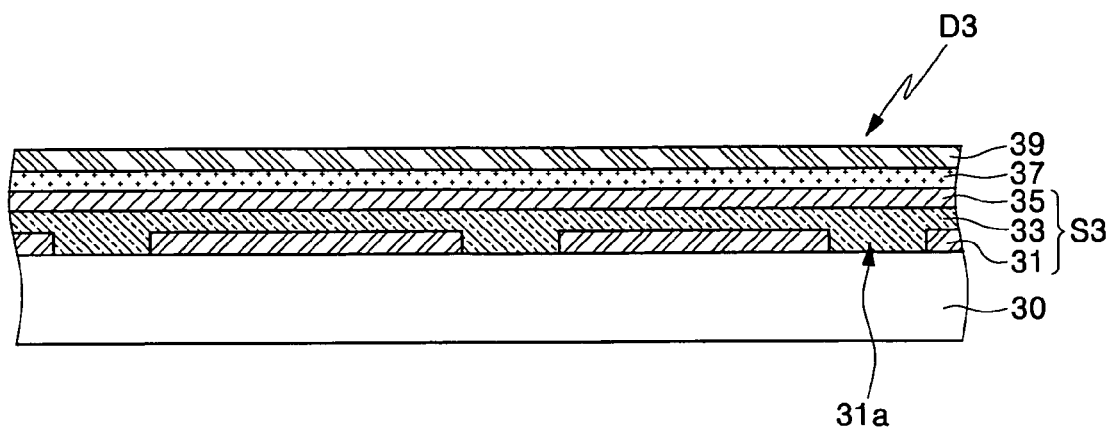
FIG. 5A is a cross-sectional view taken along Line I-I' of FIG. 4, and shows a donor substrate according to a third embodiment of the present invention.

FIG. 5A is a cross-sectional view taken along Line I-I' of FIG. 4, and shows a donor substrate according to a third embodiment of the present invention. The donor substrate according to the present embodiment is similar to the donor substrate described with reference to FIG. 2A, except as described below.

Referring to FIG. 5A, the donor substrate D3 comprises a base substrate 30 and a transfer layer 39 disposed on the base substrate 30.

A selective heat generation structure S3 is interposed between the base substrate 30 and the transfer layer 39. The selective heat generation structure S3 comprises a heat generation region from which heat is generated by light-to-heat conversion, and a heat non-generation region contacting the heat generation region.

The selective heat generation structure S3 comprises reflective layer patterns 31 selectively disposed on parts of the base substrate 30, and light-to-heat conversion layer pattern 33 covering the reflective layer patterns 31. The light-to-heat conversion layer 33 is disposed on the reflective layer patterns 31 and the area 31a of the base substrate 30 not covered by the reflective layer patterns 31. The reflective layer patterns 31 reflect a part of a laser beam inputted through the base substrate 30, thereby defining the heat non-generation region. The region 31a, in which the light-to-heat conversion layer 33 contacts the base substrate 30, absorbs and converts the absorbed laser beam into heat, thereby defining the heat generation region.

The reflective layer pattern 31 has a proper reflectance for a laser beam, and may be at least one layer selected from a group consisting of an aluminum layer, an aluminum alloy layer, a silver layer, and a silver alloy layer. The reflective layer pattern 31 can be formed on the base substrate 30 using a deposition method, which employs a highly accurate mask.

The selective heat generation structure S3 may further comprise a reflective layer 35 disposed on the light-to-heat conversion layer 33. The reflective layer 35 reflects the laser beam passing through the light-to-heat conversion layer 33, and returns the laser beam into the light-to-heat conversion layer 33. The light-to-heat conversion rate in the light-to-heat conversion layer 33 can be enhanced.

An intermediate layer 37 can be interposed between the selective heat generation structure S3 including the reflective layer 35 and the transfer layer 39. On the other hand, the reflective layer 35 may be omitted. In this case, the intermediate layer 37 can be interposed between the light-to-heat conversion layer 33 and the transfer layer 39.

Figure 5B:
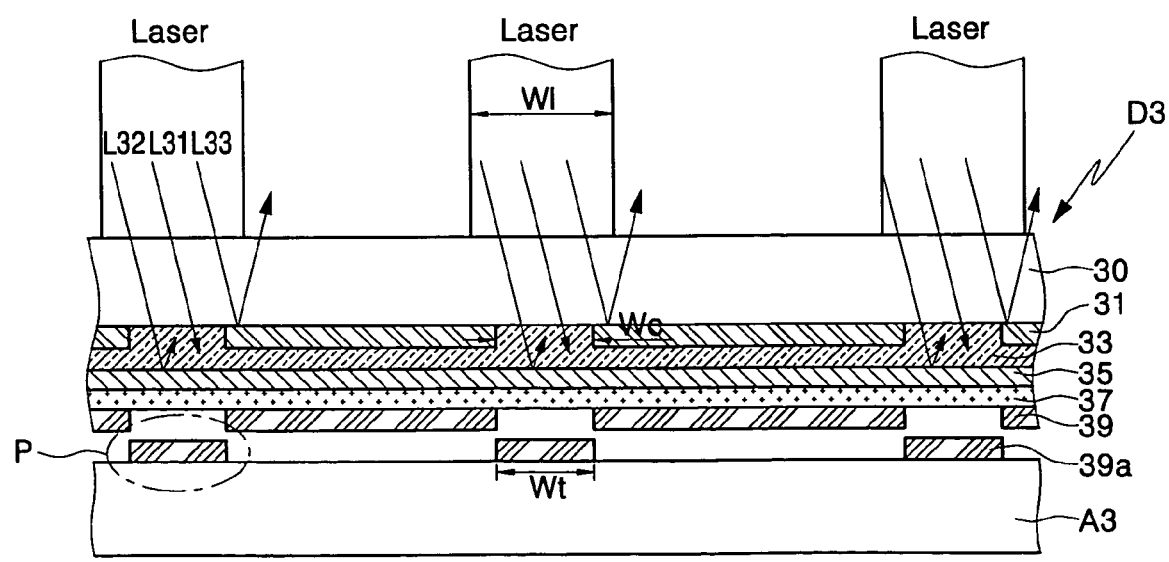
FIG. 5B is a cross-sectional view illustrating a fabrication method of an organic light emitting display using the donor substrate shown in FIG. 5A.

FIG. 5B is a cross-sectional view illustrating a fabrication method of an organic light emitting display using the donor substrate shown in FIG. 5A.

Referring to FIG. 5B, the donor substrate D3 described with reference to FIG. 5A is disposed on an acceptor substrate A3 so that the transfer layer 39 faces the acceptor substrate A3. Subsequently, a laser beam is irradiated onto the donor substrate D3. The laser beam may be a beam patterned in a line beam shape. The patterned laser beam is irradiated onto the heat generation region of the donor substrate D3. Moreover, the width W1 of the laser beam is greater than the width Wc of the heat generation region.

The laser beam L31 irradiated onto the donor substrate D3 is transmitted by the base substrate 30, and is partially absorbed by the light-to-heat conversion layer 33. Moreover, when the reflective layer 35 is provided on the light-to-heat conversion layer 33, the laser beam L32 not absorbed but transmitted by the light-to-heat conversion layer 33 is reflected by the reflective layer 35, and is returned into the light-to-heat conversion layer 33. Accordingly, the light-to-heat conversion rate in the light-to-heat conversion layer 33 can be enhanced. On the other hand, the laser beam L33 irradiated onto the reflective layer pattern 31 is reflected by the reflective layer pattern 31. As a result, heat can be selectively generated from the region of the light-to-heat conversion layer 33 contacting the exposed base substrate 30.

The heat generated from the light-to-heat conversion layer 33 degrades the adhesive power between the intermediate layer 37 and the transfer layer 39, thereby selectively transferring the transfer layer 39 onto the acceptor substrate A3. Consequently, it is possible to form the transfer layer pattern 39a on the acceptor substrate A3.

Figure 6:
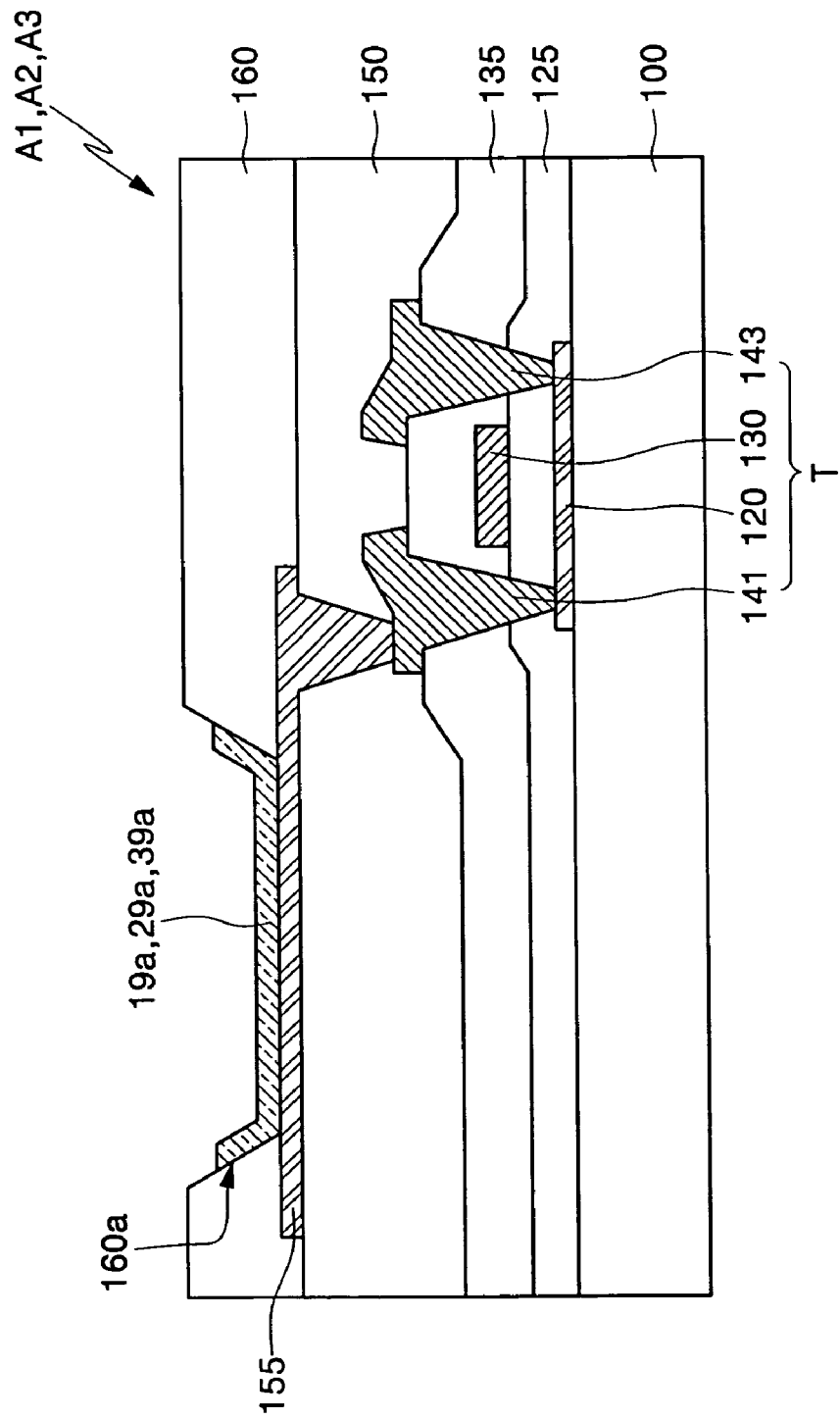
FIG. 6 is an enlarged cross-sectional view of a part of FIGS. 2B, 3B, and 5B.

FIG. 6 is an enlarged cross-sectional view of a part of FIGS. 2B, 3B, and 5B. It shows a case wherein the acceptor substrates A1, A2, and A3 are organic light emitting device substrates.

Referring to FIG. 6, a semiconductor layer 120 is disposed in a predetermined region. The semiconductor layer 120 may be made of an amorphous silicon layer or a poly silicon layer obtained by crystallizing an amorphous silicon layer. A gate insulating layer 125 is disposed on the semiconductor layer 120. A gate electrode 130 overlying the semiconductor layer 120 is disposed on the gate insulating layer 125. A first insulating interlayer 135 covering the semiconductor layer 120 and the gate electrode 130 is disposed on the gate electrode 130. A drain electrode 141 and a source electrode 143, which pass through the first insulating interlayer 135 and the gate insulating layer 125, and which are connected to respective ends of the semiconductor layer 120, are disposed on the first insulating interlayer 135. The semiconductor layer 120, the gate electrode 130, the drain electrode 141 and the source electrode 143 constitute a thin film transistor T.

A second insulating interlayer 150 covering the drain electrode 141 and source electrode 143 are disposed on the drain electrode 141 and source electrode 143. The second insulating interlayer 150 may include a passivation layer for protecting the thin film transistor T and/or a planarization layer for alleviating step differences due to the thin film transistor T. A pixel electrode 155, which passes through the second insulating interlayer 150, and which is connected to the drain electrode 141, is disposed on the second insulating interlayer 150. The pixel electrode 155 may be, for example, an ITO (Indium Tin Oxide) layer or an IZO (Indium Zinc Oxide)

layer. A pixel defining layer 160 having an opening 160*a* for exposing a part of the pixel electrode 155 is disposed on the pixel electrode 155.

The transfer layer pattern 19*a* or 29*a* or 39*a*, transferred from the donor substrate D1 of FIG. 2B or from the donor substrate D2 of FIG. 3B or from the donor substrate D3 of FIG. 5B, is disposed on the pixel electrode 155 exposed to the opening 160*a*. The transfer layer pattern 19*a* or 29*a* or 39*a* may be an organic emission layer. Moreover, the transfer layer pattern 19*a* or 29*a* or 39*a* may further include at least one layer selected from a group consisting of a hole injection layer, a hole transport layer, a hole block layer, an electron transport layer, and an electron injection layer.

According to the present invention described above, it is possible to satisfactorily form a minute transfer layer pattern without requiring accurate control of the width of a laser beam.

Although preferred embodiments of the present invention have been described in detail, it will be appreciated by those skilled in the art to which the present invention pertains that several modifications and variations can be made without departing from the spirit and scope of the present invention as defined in the appended claims. Accordingly, future variations of the embodiments of the present invention can be covered by the technique of the present invention.

What is claimed is:

1. A donor substrate, comprising:
   a base substrate;
   a transfer layer disposed on the base substrate; and
   a selective heat generation structure which is interposed between the base substrate and the transfer layer, and which includes a heat generation region from which heat is generated by light-to-heat conversion, and a heat non-generation region adjacent to the heat generation region;
   wherein the selective heat generation structure comprises a light-to-heat conversion layer pattern selectively disposed on a part of the base substrate, the light-to-heat conversion layer pattern defining the heat generation region; and
   wherein the base substrate has a recessed region, and wherein the light-to-heat conversion layer pattern is selectively disposed in the recessed region.

2. The donor substrate according to claim 1, wherein the selective heat generation structure further comprises a reflective layer disposed on a part of the base substrate not covered by the light-to-heat conversion layer pattern.

3. The donor substrate according to claim 2, wherein the reflective layer covers the light-to-heat conversion layer pattern.

4. The donor substrate according to claim 1, further comprising an intermediate layer interposed between the selective heat generation structure and the transfer layer.

5. The donor substrate according to claim 4, wherein the selective heat generation structure further comprises a reflective layer covering the light-to-heat conversion layer pattern.

6. The donor substrate according to claim 1, wherein the selective heat generation structure further comprises a reflective layer disposed on the light-to-heat conversion layer pattern and the base substrate.

7. The donor substrate according to claim 6, further comprising an intermediate layer interposed between the selective heat generation structure and the transfer layer.

8. The donor substrate according to claim 1, wherein the selective heat generation structure comprises a reflective layer pattern selectively disposed on a part of the base substrate, and a light-to-heat conversion layer covering the reflective layer pattern, the reflective layer pattern defining the heat non-generation region.

9. The donor substrate according to claim 8, further comprising an intermediate layer provided between the selective heat generation structure and the transfer layer.

10. A donor substrate, comprising:
    a base substrate;
    a transfer layer disposed on the base substrate; and
    a selective heat generation structure which is interposed between the base substrate and the transfer layer, and which includes a heat generation region from which heat is generated by light-to-heat conversion, and a heat non-generation region adjacent to the heat generation region;
    wherein the selective heat generation structure comprises a first reflective layer pattern selectively disposed on a part of the base substrate, and a light-to-heat conversion layer covering the reflective layer pattern, the reflective layer pattern defining the heat non-generation region; and
    wherein the selective heat generation structure further comprises a second reflective layer disposed on the light-to-heat conversion layer.

11. The donor substrate according to claim 10, further comprising an intermediate layer interposed between the selective heat generation structure and the transfer layer.

12. A donor substrate, comprising:
    a base substrate;
    a light-to-heat conversion layer pattern selectively disposed on a part of the base substrate;
    a reflective layer disposed on and covering the light-to-heat conversion layer pattern; and
    a transfer layer covering the reflective layer.

13. The donor substrate according to claim 12, wherein the reflective layer is also disposed on a part of the base substrate not covered by the light-to-heat conversion layer pattern.

14. The donor substrate according to claim 12, further comprising an intermediate layer interposed between the light-to-heat conversion layer pattern and the transfer layer.

15. The donor substrate according to claim 12, further comprising an intermediate layer interposed between the reflective layer and the transfer layer.

16. A donor substrate, comprising:
    a base substrate;
    a light-to-heat conversion layer pattern selectively disposed on a part of the base substrate; and
    a transfer layer disposed on the light-to-heat conversion layer pattern
    wherein the base substrate has a recessed region, and wherein the light-to-heat conversion layer pattern is selectively disposed in the recessed region.

17. The donor substrate according to claim 16, further comprising a reflective layer interposed between the transfer layer and both of the light-to-heat conversion layer pattern and the base substrate.

18. The donor substrate according to claim 16, further comprising an intermediate layer interposed between the transfer layer and both of the light-to-heat conversion layer pattern and the base substrate.

19. The donor substrate according to claim 16, further comprising:
    a reflective layer disposed on the light-to-heat conversion layer pattern and the base substrate; and
    an intermediate layer interposed between the reflective layer and the transfer layer.

20. A donor substrate, comprising:
    a base substrate;
    a reflective layer pattern selectively disposed on a part of the base substrate;

a light-to-heat conversion layer covering the reflective layer pattern; and a transfer layer disposed on the light-to-heat conversion layer.

21. The donor substrate according to claim 20, further comprising a reflective layer interposed between the light-to-heat conversion layer and the transfer layer.

22. The donor substrate according to claim 20, further comprising an intermediate layer interposed between the light-to-heat conversion layer and the transfer layer.

23. The donor substrate according to claim 20, further comprising:

a reflective layer disposed on the light-to-heat conversion layer; and an intermediate layer interposed between the reflective layer and the transfer layer.

24. A fabrication method of an organic light emitting display, the fabrication method comprising the steps of:

preparing a donor substrate, which comprises a base substrate, a transfer layer disposed on the base substrate, and a selective heat generation structure which is interposed between the base substrate and the transfer layer, the selective heat generation structure having heat generation regions from which heat is generated by light-to-heat conversion and heat non-generation regions adjacent to the heat generation regions;

disposing the donor substrate on an acceptor substrate having a pixel electrode so that the transfer layer of the donor substrate faces the acceptor substrate; and irradiating a laser beam, having a width greater than a width of each of the heat generation regions, onto the donor substrate, and forming a transfer layer pattern on the pixel electrode of the acceptor substrate.

25. The fabrication method according to claim 24, further comprising the step of providing the selective heat generation structure with light-to-heat conversion layer pattern selectively disposed on a part of the base substrate, the light-to-heat conversion layer pattern defining the heat generation regions.

26. A fabrication method of an organic light emitting display, the fabrication method comprising the steps of:

preparing a donor substrate, which comprises a base substrate, a transfer layer disposed on the base substrate, and a selective heat generation structure which is interposed between the base substrate and the transfer layer, the selective heat generation structure having a heat generation region from which heat is generated by light-to-heat conversion and a heat non-generation region adjacent to the heat generation region;

disposing the donor substrate on an acceptor substrate having a pixel electrode so that the transfer layer of the donor substrate faces the acceptor substrate;

irradiating a laser beam, having a width greater than a width of the heat generation region, onto the donor substrate, and forming a transfer layer pattern on the pixel electrode of the substrate;

providing the selective heat generation structure with a light-to-heat conversion layer pattern selectively disposed on a part of the base substrate, the light-to-heat conversion layer pattern defining the heat generation region; and providing the base substrate with a recessed region, the light-to-heat conversion layer pattern being selectively disposed in the recessed region.

27. A fabrication method of an organic light emitting display, the fabrication method comprising the steps of:

preparing a donor substrate, which comprises a base substrate, a transfer layer disposed on the base substrate, and a selective heat generation structure which is interposed between the base substrate and the transfer layer, the selective heat generation structure having a heat generation region from which heat is generated by light-to-heat conversion and a heat non-generation regiono tha adjacent to the heat generation region;

disposing the donor substrate on an acceptor substrate having a pixel electrode so that the transfer layer of the donor substrate faces the acceptor substrate;

irradiating a laser beam, having a width greater than a width of the heat generation region, onto the donor substrate, and forming a transfer layer pattern on the pixel electrode of the acceptor substrate; and providing the selective heat generation structure with a reflective layer pattern selectively disposed on a part of the base substrate, and with a light-to-heat conversion layer covering the reflective layer pattern, the reflective layer pattern defining the heat non-generation region.

28. The fabrication method according to claim 24, wherein the transfer layer pattern comprises an emission organic layer.

29. The fabrication method according to claim 28, wherein the transfer layer pattern further comprises at least one selected from a group consisting of a hole transport layer, a hole injection layer, a hole blocking layer, an electron transport layer, and an electron injection layer.

* * * * *